US009659859B2

(12) United States Patent
Chen et al.

(10) Patent No.: US 9,659,859 B2
(45) Date of Patent: May 23, 2017

(54) METAL PAD OFFSET FOR MULTI-LAYER METAL LAYOUT

(71) Applicant: Taiwan Semiconductor Manufacturing Company, Ltd., Hsin-Chu (TW)

(72) Inventors: I-Chih Chen, Tainan (TW); Ying-Hao Chen, Tainan (TW); Chi-Cherng Jeng, Tainan (TW); Volume Chien, Tainan (TW); Fu-Tsun Tsai, Tainan (TW); Kun-Huei Lin, Tainan (TW)

(73) Assignee: TAIWAN SEMICONDUCTOR MANUFACTURING COMPANY, LTD., Hsin-chu (TW)

( * ) Notice: Subject to any disclaimer, the term of this patent is extended or adjusted under 35 U.S.C. 154(b) by 0 days.

(21) Appl. No.: 14/809,580

(22) Filed: Jul. 27, 2015

(65) Prior Publication Data

US 2015/0333007 A1    Nov. 19, 2015

Related U.S. Application Data

(63) Continuation of application No. 14/059,102, filed on Oct. 21, 2013, now Pat. No. 9,093,430.

(Continued)

(51) Int. Cl.
*H01L 23/522* (2006.01)
*H01L 23/48* (2006.01)
(Continued)

(52) U.S. Cl.
CPC ...... *H01L 23/5226* (2013.01); *G06F 17/5077* (2013.01); *H01L 21/76805* (2013.01); *H01L 21/76877* (2013.01); *H01L 21/76897* (2013.01); *H01L 23/3171* (2013.01); *H01L 23/481* (2013.01); *H01L 23/522* (2013.01); *H01L 23/528* (2013.01); *H01L 23/5283* (2013.01); *H01L 23/5329* (2013.01); *H01L 24/03* (2013.01); *H01L 24/05* (2013.01); *H01L 24/94* (2013.01); *H01L 24/16* (2013.01); *H01L 24/29* (2013.01); *H01L 24/32* (2013.01); *H01L 2224/0401* (2013.01); *H01L 2224/04026* (2013.01); *H01L 2224/05022* (2013.01); *H01L 2224/05085* (2013.01);
(Continued)

(58) Field of Classification Search
CPC .......................... H01L 23/481; G06F 17/2077
USPC .......................................................... 257/774
See application file for complete search history.

(56) References Cited

U.S. PATENT DOCUMENTS 5,378,927 A    1/1995    McAllister et al.
5,757,079 A    5/1998    McAllister et al.
(Continued)

FOREIGN PATENT DOCUMENTS

EP    0445759 A1    9/1991
EP    1069617 A2    1/2001
TW    1243476 B     11/2005

*Primary Examiner* — Fernando L Toledo
*Assistant Examiner* — Adam S Bowen
(74) *Attorney, Agent, or Firm* — Haynes and Boone, LLP

(57) ABSTRACT

A semiconductor device includes a first layer including a number of first layer metal pads, a second layer formed on top of the first layer, the second layer including a number of second layer metal pads, and vias connecting the first layer metal pads to the second layer metal pads. A surface area overlap between the first layer metal pads and the second layer metal pads is below a defined threshold.

20 Claims, 6 Drawing Sheets

Related U.S. Application Data

(60) Provisional application No. 61/866,893, filed on Aug. 16, 2013.

(51) Int. Cl.
    *G06F 17/50*     (2006.01)
    *H01L 23/31*     (2006.01)
    *H01L 23/528*     (2006.01)
    *H01L 21/768*     (2006.01)
    *H01L 23/532*     (2006.01)
    *H01L 23/00*     (2006.01)

(52) U.S. Cl.
    CPC ............... *H01L 2224/05092* (2013.01); *H01L 2224/05124* (2013.01); *H01L 2224/05147* (2013.01); *H01L 2224/05184* (2013.01); *H01L 2224/05567* (2013.01); *H01L 2224/05624* (2013.01); *H01L 2224/05647* (2013.01); *H01L 2224/05684* (2013.01); *H01L 2224/16145* (2013.01); *H01L 2924/0002* (2013.01)

(56) References Cited

U.S. PATENT DOCUMENTS

| | | |
|---|---|---|
| 6,444,919 B1 | 9/2002 | Economikos et al. |
| 2004/0147117 A1* | 7/2004 | Ngo .................. H01L 21/76831 438/687 |
| 2004/0232445 A1 | 11/2004 | Nakamoto |
| 2008/0099884 A1* | 5/2008 | Inohara ................. H01L 23/562 257/620 |
| 2010/0193930 A1 | 8/2010 | Lee |
| 2010/0264545 A1 | 10/2010 | Collins et al. |
| 2013/0285251 A1 | 10/2013 | LaCroix et al. |
| 2013/0307160 A1 | 11/2013 | Farooq et al. |
| 2015/0048518 A1 | 2/2015 | Chen |

\* cited by examiner

METAL PAD OFFSET FOR MULTI-LAYER METAL LAYOUT

PRIORITY CLAIM

The present application is a continuation of U.S. application Ser. No. 14/059,102 filed on Oct. 21, 2013, which claims priority to U.S. Provisional Patent Application No. 61/866,893 filed on Aug. 16, 2013, each of which is hereby incorporated herein by reference in its entirety.

BACKGROUND

Many semiconductor devices make use of interconnect layers that connect circuitry from electronic components formed on one layer to electronic components formed on either a different layer or a different chip to be bonded with the interconnect layer. For example, an image sensor array may be bonded to an interconnect layer that connects the individual pixels within the array to addressing circuitry that is formed on a device wafer and bonded to the interconnect layer. Each layer within the multi-layer interconnect layer may include metal lines and metal pads. The metal pads have a much larger area than the metal lines and may be used for bonding or for via landings.

During the formation of metal pads within the interconnect layer, a chemical-mechanical polishing (CMP) process is often used to level out the top of the metal pads that have been deposited into a substrate. In some cases, the CMP process causes a dishing effect in the metal pads. As the metal pads from multiple layers are formed over each other, this dishing effect accumulates. The top layer metal pads may thus have a substantial dishing affect which may cause difficulties when bonding the interconnect layer to another wafer such as a carrier wafer. Thus, it is desirable to find ways of forming interconnect layers with metal pads without the dishing effects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1A:
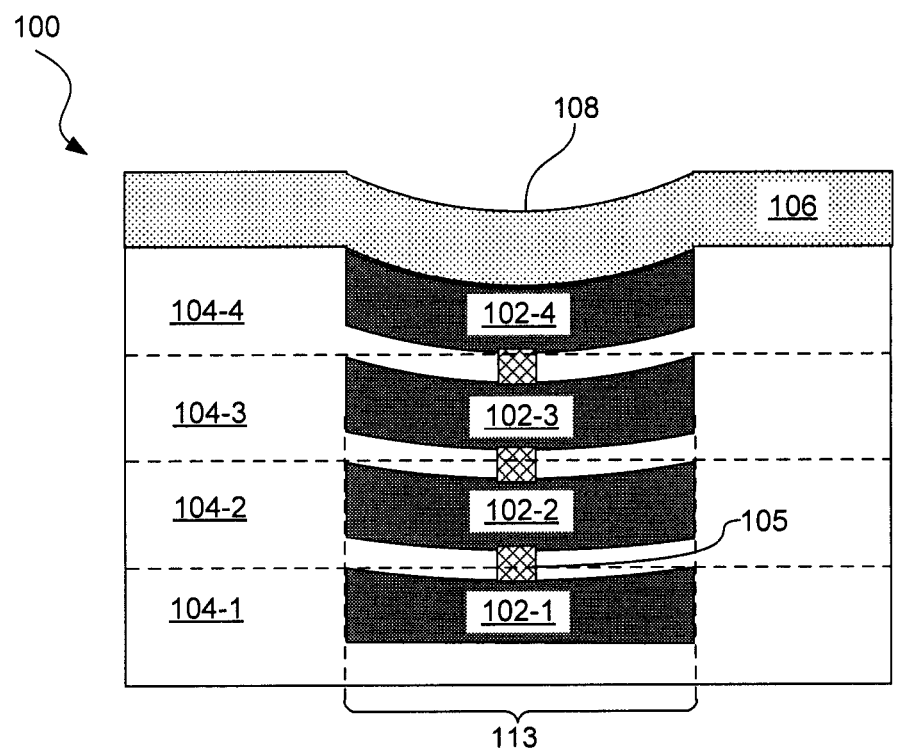
FIG. 1A is a diagram showing an illustrative multi-layer metal pad layout, according to one example of principles described herein.

FIG. 1A is a diagram showing an illustrative multi-layer metal pad layout, according to the present example, each metal pad 102 in each layer 104 is aligned with other pads in the other layers. Additionally, the metal pads 102 may be connected to metal pads from different layers through vias 105. A via 105 is a hole formed through a material. The hole is often filled with a conductive material such as metal in order to provide an electrical connection between two metal pads. As illustrated, the dishing effects become more severe for the metal pads 102 of the upper layers 104.

When forming a metal pad 102 into a multi-layer interconnect layer 100, a metal material is deposited into a hole that is etched into the first layer 104-1. A chemical-mechanical polishing (CMP) process is then used to smooth out the surface of the first layer 104-1. The first layer 104-1 may be made of a semiconductor material or a dielectric material.

For a semiconductor material, the first layer 104-1 may include, among other things, a silicon wafer. Alternatively or additionally, the first layer 104-1 may include another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP. In yet another alternative, the first layer 104-1 may also include a dielectric layer, a conducting layer, or combination thereof.

For a dielectric material, the first layer 104-1 may be formed of a non-low-k dielectric material having a k value greater than 3.9, such as silicon oxide ($SiO_2$), silicon nitride (SiN), or silicon oxynitride (SiON). In an embodiment, the first layer 104-1 is formed of an oxide such as un-doped silicate glass (USG), boron-doped silicate glass (BSG), phosphorous-doped silicate glass (BSG), boron-doped phospho-silicate glass (BPSG), or the like. The first layer 104-1 may also be formed of a silicon oxide layer and a silicon nitride layer on the silicon oxide layer. The first layer 104-1 may alternatively be formed of a low-k dielectric material having a k value less than 3.9, such as fluorine-doped silicon oxide, carbon-doped silicon oxide, porous silicon oxide, porous carbon-doped silicon oxide, organic polymers, or silicone based polymers. In these embodiments, the first layer 104-1 may be formed using a chemical vapor deposition (CVD) or a physical vapor deposition (PVD) process.

In general, such materials 104-1 are harder than the materials used to form the metal pad 102. For example, the metal pads 102 may be made of a material such as copper, which is softer than the semiconductor or dielectric material on which the metal is formed. Thus, the CMP process will cause a dishing effect in the metal pad 102-1. This dishing effect is typically nominal with respect to metal lines because metal lines are much narrower in size. The metal pads 102, however, are much larger in size and are thus more prone to dishing. In other embodiments, the metal pads 104 may include a metal or a metal alloy, such as Al, W, Al alloy, Cu alloy, or W alloy.

When forming the next layer 104-2, an inter-layer dielectric (ILD) layer is deposited on top of the first metal pad 102-1 of the first layer 104-1. The ILD layer may include one or more of the above-listed dielectric materials for layer 104-1. This ILD layer will be subject to a small amount of dishing because of the underlying dishing effect of the first layer 104-1 metal pad 102-1. Thus, when forming the metal pad 104-2 above the underlying metal pad 102-1, the dishing effect becomes even more significant for the second layer 104-2 metal pad 102-2. This cumulative dishing effect continues for the metal pad 102-3 of the third layer 104-3 and the metal pad 102-4 of the fourth layer 104-4. Thus, the top metal pad 102-4 will be subject to substantial dishing due to the near complete overlap 113 of the metal pads 102. The top layer 104-4 may be bonded to another wafer such that the top metal pad 102-4 is electrically connected to a metal pad on the other wafer. For example, a device wafer may be bonded to the multi-layer interconnect layer 100. To do this, a passivation layer 106 may be placed over the top metal layer. This leaves a pocket 108 that may cause problems during the bonding process. For example, if there are several pockets 108 within the bonding area, the heat resulting from the bonding process will push that air out to the side, which may cause wafer warping and other issues. Thus, it is desirable to minimize or eliminate this dishing effect.

Figure 1B:
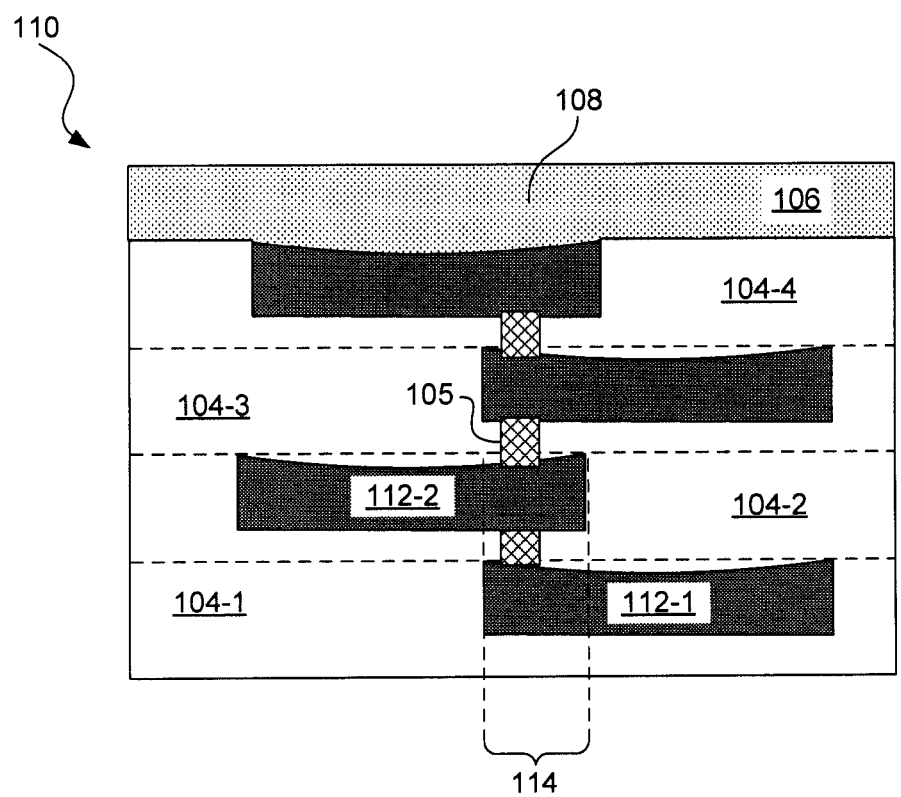
FIG. 1B is a diagram showing an illustrative multi-layer metal pad layout that has been adjusted to reduce dishing effects, according to one example of principles described herein.

FIG. 1B is a diagram showing an illustrative multi-layer metal pad layout 110 that has been adjusted to reduce dishing effects. According to the present example, the cumulative dishing effect is reduced by adjusting the metal pad layout so that the amount of overlap 114 is reduced in comparison to the overlap 113 illustrated in FIG. 1A. Specifically, by reducing the overlap 114, the dishing effect does not transfer to subsequently formed levels as much. Thus, in this example, the overlap between the first layer metal pad 112-1 only partially overlaps with the metal pad 112-2 of the second layer 104-2.

The degree of overlap is reduced below a determined or defined threshold. For example, it may be determined by a layout designer that reducing the overlap of metal pads below 50% is sufficient. The overlap may be defined in a variety of manners. It may mean that for any given metal pad, not more than 50% of the surface area will overlap 114 with an adjacent level. Alternatively, it may mean that for an entire layer, the total surface area of all the metal pads on that layer overlaps with metal pads from an adjacent layer. Other percentages may be used by the designer. For example, the designer may wish to reduce the overlap to 20%, 30%, 40%, 60% or any range in between those percentages.

The overlap 114 should not be completely eliminated because there has to be enough overlap 114 to allow the vias 105 to form a sufficient electrical connection between two metal pads 112 of adjacent layers. As mentioned above, a via is typically a hole formed between two layers that is typically filled in with a conductive material. Thus, the term "via" as used herein, refers to a conductive feature between two metal pads. A sufficient electrical connection is one that allows the circuitry associated with the connection to operate within desired parameters. Thus, the overlap 114 may be adjusted to be as small as possible while still allowing room for adequate via connections to be made.

Figure 2A:
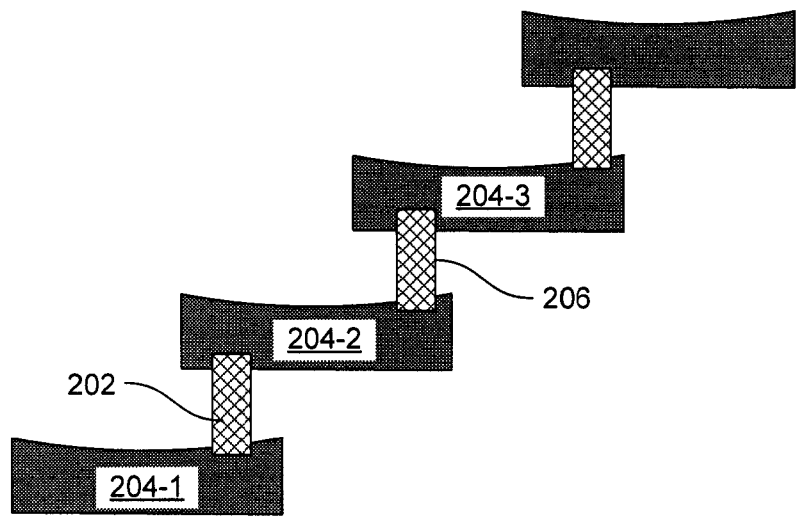
FIGS. 2A and 2B are diagrams showing illustrative offsets between metal pads of adjacent layers, according to one example of principles described herein.
Figure 2B:
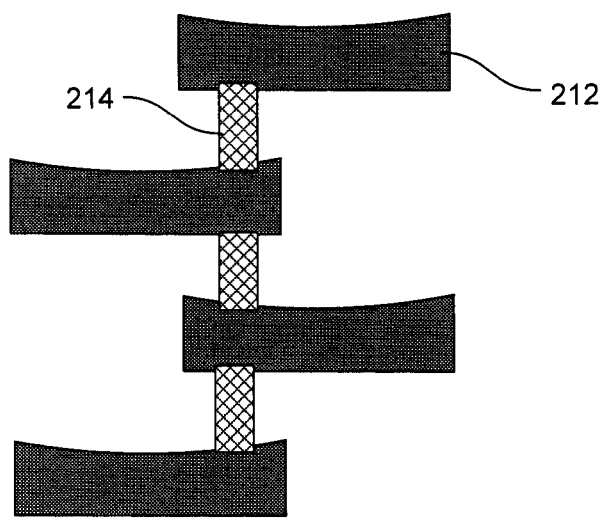

FIGS. 2A and 2B are diagrams showing illustrative offsets between metal pads of adjacent layers. FIG. 2A illustrates an example where the offset direction for each metal pad 202 is in the same direction. For example, for each successive layer, the metal pad is offset in a single direction. Thus, for a given metal pad 204-2 the via 202 connecting to a lower metal pad 204-1 is on the opposite side from the via 206 connecting to an upper metal pad 204-3. Although a single via is shown between each successive metal pad layer 204, more vias may be used. For the sake of reference, this arrangement of offset metal pads can be generally referred to as a stair-step arrangement. In the present embodiment, metal pad 204-1 is completely non-aligned with and non-overlapping, from a top perspective, with metal pad layer 204-3.

FIG. 2B illustrates an example where the offset direction for each metal pad 212 alternates between successive layers. Specifically, all the vias 214 are aligned while the metal pads alternate in position. Again, although a single via is shown between each successive metal pad layer 212, more vias may be used. For the sake of reference, this arrangement of offset metal pads can be generally referred to as a tree-shape arrangement, with the vias representing a trunk of the tree. In the present embodiment, the lowest metal pad in the figure is completely aligned with and overlapping, from a top perspective, with the second-highest metal pad in the figure.

Other examples not explicitly illustrated may also be used in accordance with principles described herein. For example, the stair-step arrangement can advance in one direction for one or more metal pad layers, and then another direction for the next one or more metal pad layers. In another example, the tree-shape arrangement can include one or more sequential metal pad layers extending in a first direction, and one or more other sequential metal pad layers extending in a second direction. In yet another example, the sequence of metal pad layers can start in one arrangement, such as the stair-step arrangement, and then change to a different arrangement, such as the tree-shape arrangement.

Figure 3A:
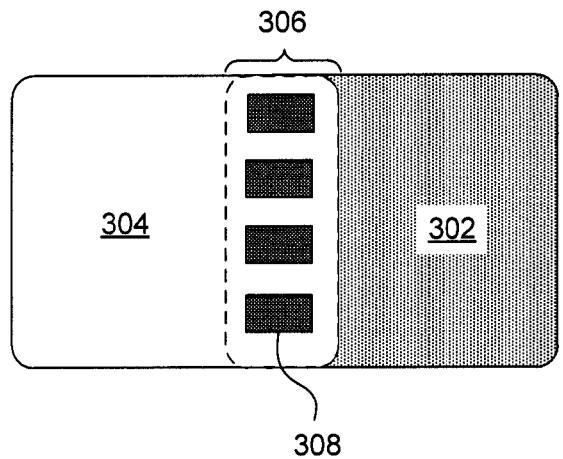
FIGS. 3A and 3B are diagrams showing illustrative top views of metal pad offsets between adjacent layers, according to one example of principles described herein.
Figure 3B:
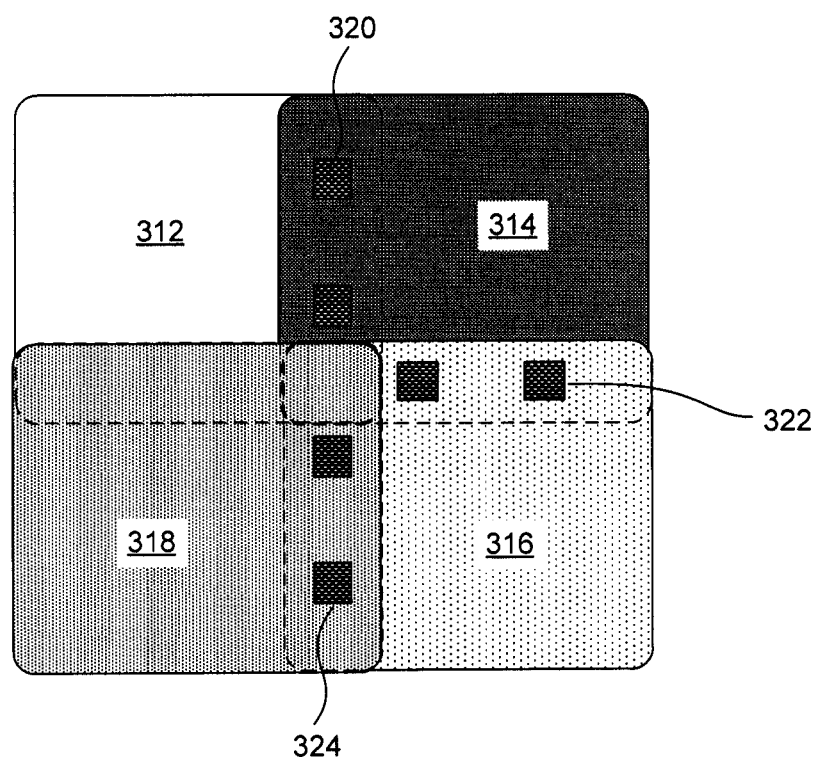

FIGS. 3A and 3B are diagrams of illustrative top views of metal pad offsets between adjacent layers. FIG. 3A illustrates a top view 300 of two metal pads 302 and 304 overlapping. In some cases, multiple vias 308 may be used to connect one metal pad to another metal pad. In this example, the first metal pad 302 of a first layer connects to a second metal pad 304 of a second layer. Four vias 308 are positioned within the overlapping region 306. This pattern may continue through successive layers that are either offset in the same direction or alternating directions.

FIG. 3B is a diagram illustrating four metal pads of different layers, each successive layer being offset in one of four directions. Specifically, the first metal pad 312 of a first layer is connected to the second metal pad 314 of a second layer. A set of vias 320 are used to connect the two metal pads 312, 314 in the overlapping region.

Additionally, the second metal pad 314 is connected to a third metal pad 316 of a third layer above the second layer. A set of vias 322 connects the second metal pad 314 to the third metal pad 316. The third metal pad 316 is offset in a direction that is perpendicular to the offset direction between the first metal pad 312 and second metal pad 314.

Additionally, the third metal pad 316 is connected to a fourth metal pad 318 of a fourth layer above the third layer. A set of vias 324 connects the third metal pad 316 to the fourth metal pad 318. The fourth metal pad 318 is offset in a direction that is parallel to the offset direction between the first metal pad 312 and second metal pad 314.

Other metal layout schemes may be used to reduce the overlap. For example the offset directions may be in a variety of directions and not limited to a specific set. While FIG. 3B shows some overlap between the first metal pad 312 and fourth metal 318, the offsets may be adjusted so that there is no overlap between metal pads in non-successive layers. The metal layout scheme may depend on a variety of factors that include the design goals of the circuitry.

Figure 4:
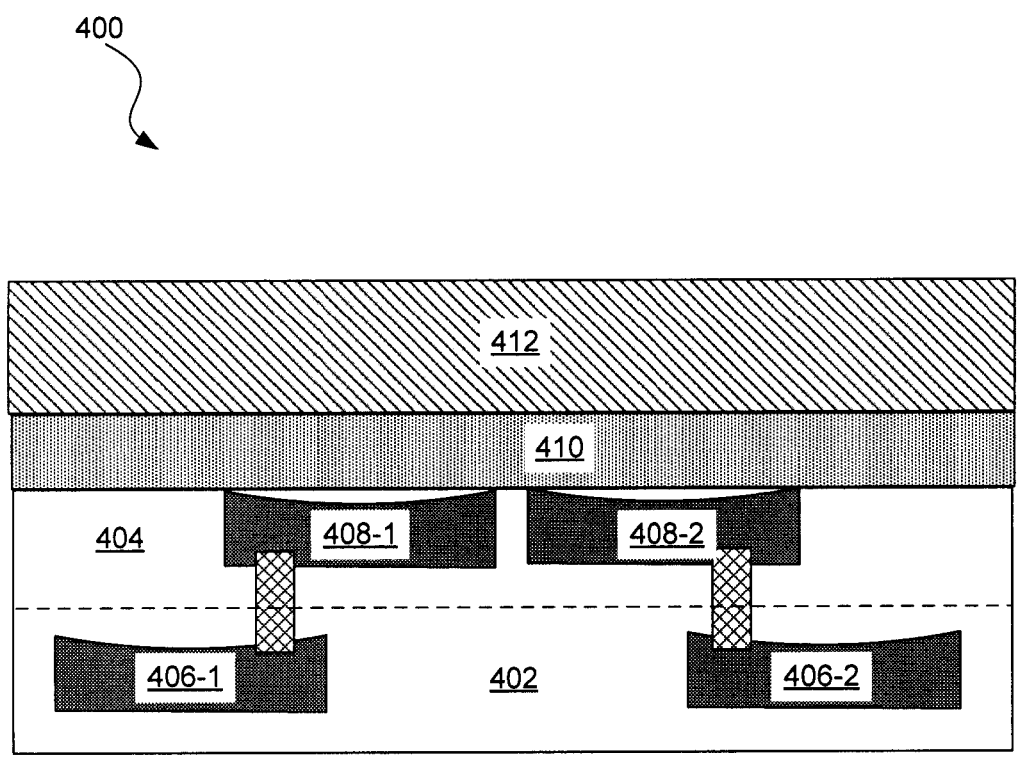
FIG. 4 is a diagram showing multiple metal pads per layer having been adjusted differently to reduce overlap, according to one example of principles described herein.

FIG. 4 is a cross-sectional diagram of multiple metal pads per layer having been adjusted differently to reduce overlap. According to certain illustrative examples, each metal pad in a single layer may be adjusted similarly, so that each metal pad is offset in the same direction and by the same distance. This may be done if the metal pads from multiple layers are aligned. In other cases, however, each metal pad within a specific layer may be adjusted differently to achieve the goals of reducing overlap as much as possible.

FIG. 4 illustrates two metal pads 406-1 and 406-2 in a first layer 402 and two metal pads 408-1 and 408-2 of a second layer 404. The first metal pad 406-1 of the first layer 402 is offset in a first direction from the first metal pad 408-1 of the second layer 404. The second metal pad 406-2 of the first layer 402 is offset in a second direction from the second metal pad 408-2 of the second layer 404. The first direction is opposite from the second direction.

Additionally, a passivation layer 410 is formed on top of the second layer 404. Another wafer 412, such as a device wafer or a carrier wafer, is then bonded to the passivation layer. A device wafer may be a separately formed semiconductor layer that includes a variety of circuitry formed therein. The circuitry of the device layer may be electrically connected to the metal pads 408. Because the cumulative dishing effect has been reduced, this bonding process can be done more efficiently and with fewer adverse effects.

Figure 5:
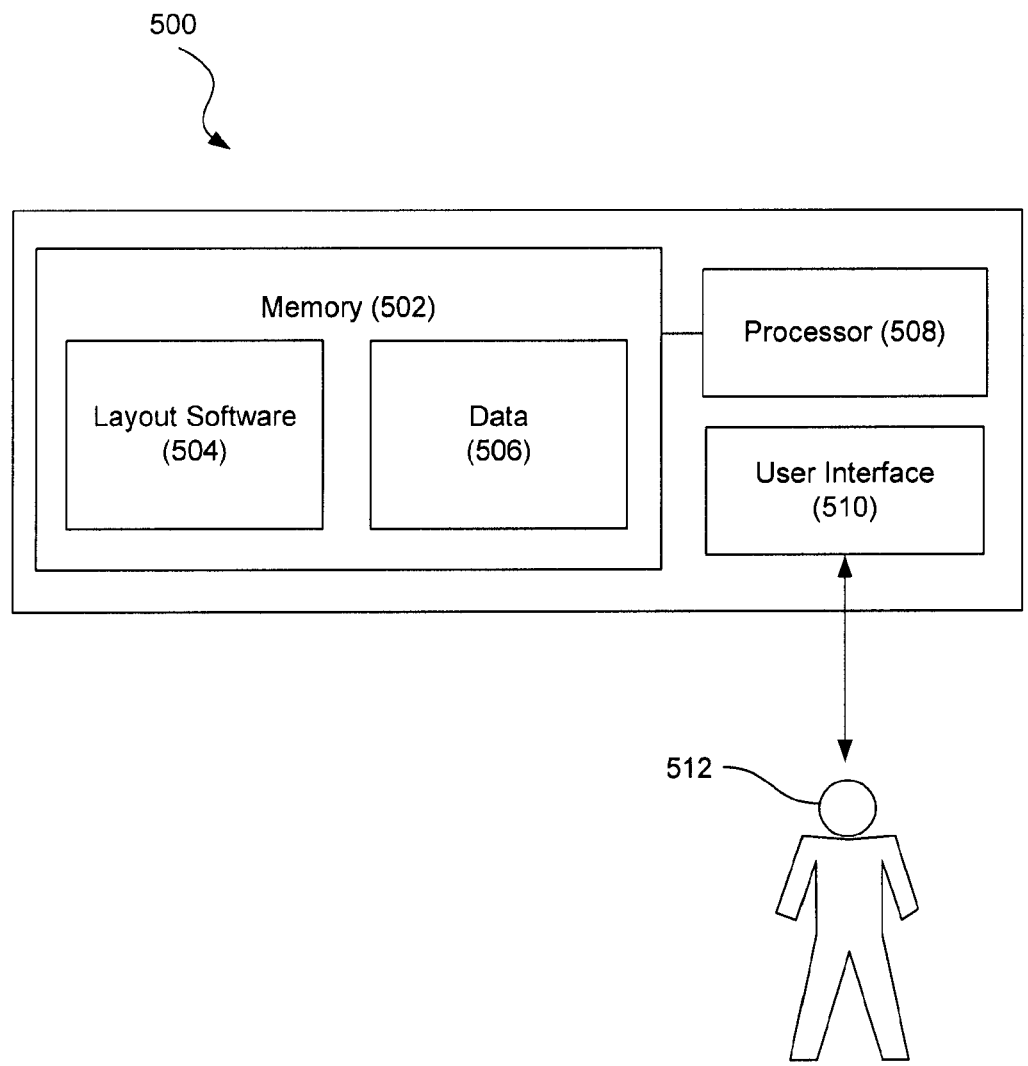
FIG. 5 is diagram showing an illustrative computing system for modeling layouts, according to one example of principles described herein.

FIG. 5 is diagram showing an illustrative computing system for modeling layouts. According to certain illustrative examples, the physical computing system 500 includes a memory 502 having modeling software 504 and data 506 stored thereon. The physical computing system 500 also includes a processor 508 and a user interface 510.

There are many types of memory available. Some types of memory, such as solid state drives, are designed for storage. These types of memory typically have large storage volume but relatively slow performance. Other types of memory, such as those used for Random Access Memory (RAM), are optimized for speed and are often referred to as "working memory." The various forms of memory may store information in the form of software 504 and data 506. Specifically, the memory may store software for adjusting a multi-layer design layout so that there is less overlap between metal pads of different layers.

The physical computing system 500 also includes a processor 508 for executing the software 504 and using or updating the data 506 stored in memory 502. In addition to storing the modeling software 504, the memory 502 may store an operating system. An operating system allows other applications to interact properly with the hardware of the physical computing system. The processor may, for example, process a set of computer readable instructions that cause the processor to make adjustments to the circuit design layout to reduce overlap of metal pads.

The layout software 504 may include the tools to extract a multi-layer metal layout from a circuit design. The layout software 504 may also include the tools to adjust that layout in order to reduce the overlap between metal pads of different layers and thereby reduce the cumulative dishing effect.

A user interface 510 may provide a means for a user 512 to interact with the system. The user may use various tools such as a keyboard or a mouse to input information into the physical computing system. For example, the user 512 may interact with the system to enter design related information. The user 512 may also specify thresholds for reducing the overlap. Additionally, various output devices such as a monitor may be used to provide information to the user 512. The output devices may display the circuit design schematics and the adjustments being made.

Figure 6:
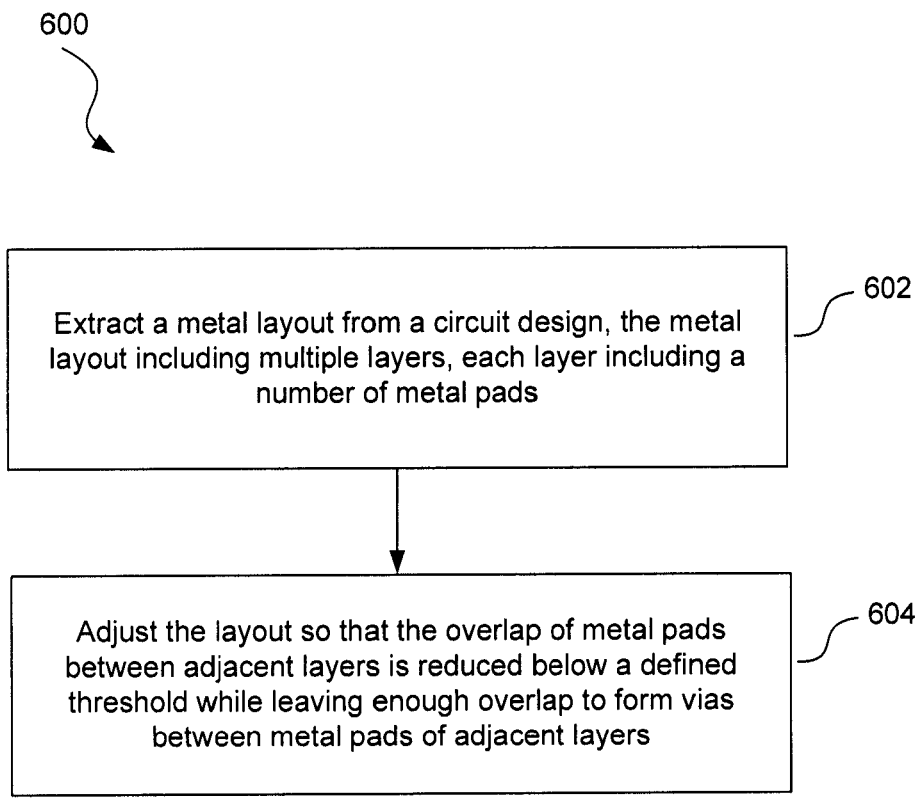
FIG. 6 is a flowchart showing an illustrative method for adjusting a multi-layer metal pad layout, according to one example of principles described herein.

FIG. 6 is a flowchart showing an illustrative method 600 for adjusting a multi-layer metal pad layout. According to certain illustrative examples a method for forming a multi-layer metal layout includes a step for extracting 602 a metal layout from a circuit design. For example, a circuit schematic may be designed to perform a particular function. This circuit schematic may be extracted to form the metal layout that will create that circuit. This may be done automatically or manually. This metal layout may include multiple layers, each layer including a number of metal pads.

The method 600 further includes a step for adjusting 604 the layout so that the overlap of metal pads between adjacent layers is reduced below a defined threshold while leaving enough overlap to form vias between metal pads of adjacent layers. For example, the layout may be adjusted so that the overlap is reduced below a defined threshold. Specifically, a designer may define a threshold of 50%. Thus, the overlap will be adjusted until there is less than 50% overlap of metal pads between adjacent layers. This overlap threshold may be the same for each layer.

Alternatively, different layers may have different defined thresholds. For example, the overlap between a first and second layer may have a threshold of 50%. Additionally, the overlap between the second layer and a third layer may have a 40% threshold. The overlap threshold may be selected while considering the minimum overlap that is used for electrical connection between adjacent layers through the vias. The minimum overlap may depend on a variety of factors including the metal pad size, via size, and overall layout scheme. In some examples, the size of a metal pad may be adjusted, if doing so does not adversely affect an electrical connection to that pad.

In the foregoing discussion, by fabricating a device, various processes, such as a film deposition process, a lithography process, an etching process, an ion implantation process, a CMP process, and a cleaning process, are performed. In the present embodiments, the film deposition process includes depositing a physical vapor deposition (PVD) process such as evaporation and DC magnetron sputtering, a plating process such as electrode-less plating or electroplating, a chemical vapor deposition (CVD) process such as atmospheric pressure CVD (APCVD), a low pressure CVD (LPCVD), a plasma enhanced CVD (PECVD), or a high density plasma CVD (HDP CVD), an ion beam deposition, spin-on coating, a metal-organic decomposition (MOD), an atomic layer deposition (ALD) process and/or other suitable methods.

The present disclosure provides many different embodiments of a semiconductor device and a method for making same. In one embodiment, a semiconductor device includes a first layer including a number of first layer metal pads, a second layer formed on top of the first layer, the second layer including a number of second layer metal pads, and vias connecting the first layer metal pads to the second layer metal pads. A surface area overlap between the first layer metal pads and the second layer metal pads is below a defined threshold while still allowing space for the vias to make a sufficient electrical connection.

In some embodiments, the lithography process may include coating a resist film on a wafer substrate, exposing the resist film deposited on the wafer substrate by an optical lithography tool or an electron beam writer, and developing the exposed resist film to form a resist pattern for an ion implantation process or an etching process. The coating the resist film on the wafer substrate includes performing a dehydration process before applying the resist film on the wafer substrate, which can enhance an adhesion of the resist film to the wafer substrate. The dehydration process may include baking the substrate at a high temperature for a duration of time, or applying a chemical such as hexamethyldisilizane (HMDS) to the substrate. The coating the resist film on the wafer substrate may include a soft bake (SB). The exposing the resist film deposited on the wafer substrate includes using an optical exposing tool or a charged particle exposing tool. The optical lithography tool may include an Mine, a deep ultraviolet (DUV), or an extreme ultraviolet (EUV) tool. The charged particle exposing tool includes an electron beam or an ion beam tool. The using the optical exposing tool includes using a mask. The mask may be a binary mask (BIM), a super binary mask (SBIM), or a phase shift mask (PSM), which includes an alternative phase shift mask (alt. PSM) or an attenuated phase shift mask (att. PSM). Developing the exposed resist film may include a post exposure bake (PEB), a post develop bake (PDB) process, or a combination thereof.

The etching process may include a dry (plasma) etching, a wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

In one embodiment, a method for forming a multi-layer metal layout includes extracting a metal layout from a circuit design, the metal layout including multiple layers, each layer including a number of metal pads, and adjusting the layout so that the overlap of metal pads between adjacent layers is reduced below a defined threshold while leaving enough overlap to form vias between metal pads of adjacent layers.

In another embodiment, a semiconductor device includes multiple layers, each layer including at least one metal pad, vias providing an electrical connection between a metal pad of one of the multiple layers to a metal pad of an adjacent one of the multiple layers, a passivation layer formed on top of the multiple layers, and a carrier wafer bonded to the passivation layer such that electrical connections are made to the second layer metal pads through the passivation layer. An overlap of metal pads between adjacent layers is below a defined threshold while leaving enough overlap to form vias between metal pads of adjacent layers.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
   forming a first dielectric layer over a semiconductor substrate, wherein the first dielectric layer includes a first metal pad;
   forming a second dielectric layer over the first dielectric layer, wherein the second dielectric layer includes a second metal pad that is not aligned with the first metal pad;
   forming a third dielectric layer over the second dielectric layer, wherein the third dielectric layer includes a third metal pad that is aligned with the first metal pad;
   forming a first via extending through the first and second dielectric layers, wherein the first via physically contacts the first and second metal pads;
   forming a second via extending through the second and third dielectric layers, wherein the second via physically contacts the second and third metal pads;
   forming a passivation layer over the third dielectric layer; and
   bonding another semiconductor substrate to the passivation layer.

2. The method of claim 1, wherein the first dielectric layer includes a dielectric material having a dielectric constant greater than 3.9.

3. The method of claim 1, wherein the first dielectric layer includes a dielectric material having a dielectric constant less than 3.9.

4. The method of claim 1, forming a third via extending through the first and second dielectric layers, wherein the third via physically contacts the first and second metal pads.

5. The method of claim 1, further comprising forming a fourth dielectric layer over the third dielectric layer, wherein the fourth dielectric layer includes a fourth metal pad that is aligned with the second metal pad; and
forming a third via extending through the third and fourth dielectric layers, wherein the third via physically contacts the third and fourth metal pads.

6. The method of claim 5, wherein the first via is aligned with the third via.

7. The method of claim 1, wherein the first metal pad has a top surface having a total surface area, wherein the second metal pad does not overlap more than 50% of the total surface area of the top surface of the first metal pad.

8. The method of claim 1, wherein the second dielectric layer is formed of a different material than the first dielectric layer.

9. A device comprising:
a first metal pad disposed over a semiconductor substrate;
a second metal pad disposed over the first metal pad and offset from the first metal pad in a first direction along a first axis;
a third metal pad disposed over the second metal pad and offset from the second metal pad in a third direction along a second axis, the second axis being different from the first axis;
a fourth metal pad disposed over the third metal pad and offset from the third metal pad in a second direction along the first axis, the second direction being opposite the first direction;
a first via extending from the first metal pad to the second metal pad;
a second via extending from the second metal pad to the third metal pad; and
a third via extending from the third metal pad to the fourth metal pad.

10. The device of claim 9, wherein the fourth metal pad overlaps the third, second, and first metal pads.

11. The device of claim 9, wherein the third metal pad overlaps the second and first metal pads.

12. The device of claim 9, wherein the first via and the third via are aligned along the second axis.

13. The device of claim 9, wherein the first metal pad has a top surface having a total surface area, wherein the second metal pad does not overlap more than 50% of the total surface area of the top surface of the first metal pad,
wherein the second metal pad has a top surface having a total surface area, wherein the third metal pad does not overlap more than 50% of the total surface area of the top surface of the second metal pad, and
wherein the third metal pad has a top surface having a total surface area, wherein the fourth metal pad does not overlap more than 50% of the total surface area of the top surface of the third metal pad.

14. The device of claim 9, wherein the second axis is perpendicular to the first axis,
wherein the fourth metal pad is offset from the first metal pad in the third direction along the second axis,
wherein the third metal pad is offset from the first metal pad in the third direction along the second axis, and
wherein the second metal pad is offset from the fourth metal pad in a fourth direction along the second axis, the fourth direction being opposite the third direction.

15. A device comprising:
a first dielectric layer having a first metal pad disposed over a semiconductor substrate;
a second dielectric layer having a second metal pad disposed over the first dielectric layer,
a third dielectric layer having a third metal pad disposed over the second dielectric layer, wherein the third metal pad is aligned with the first metal pad and wherein the third metal pad is not aligned with the first metal pad;
a first via extending through the first and second dielectric layers, wherein the first via physically contacts the first and second metal pads;
a second via extending through the second and third dielectric layers, wherein the second via physically contacts the second and third metal pads; and
a passivation layer disposed directly on a top surface of the third metal pad, the top surface of the third metal pad facing away from the semiconductor substrate.

16. The device of claim 15, further comprising a fourth dielectric layer having a fourth metal pad disposed under the first dielectric layer, wherein the fourth metal pad is aligned with the second metal pad and wherein the fourth metal pad is not aligned with the third metal pad.

17. The device of claim 16, wherein the fourth metal pad has a top surface having a total surface area, wherein the first metal pad overlaps a first amount of the total surface area of the top surface of the fourth metal pad, and
wherein the second metal pad has a top surface having a total surface area, wherein the third metal pad overlaps a second amount of the total surface area of the top surface of the second metal pad, the second amount being different than the first amount.

18. The device of claim 15, wherein the first, second, and third dielectric layers include a dielectric material having a dielectric constant greater than 3.9.

19. The device of claim 15, further comprising a fourth dielectric layer having a fourth metal pad disposed under the third dielectric layer, wherein the fourth metal pad is not aligned with the third metal pad.

20. The device of claim 15, wherein the first metal pad does not overlap more than 50% of the total surface area of the top surface of the fourth metal pad, and
wherein the third metal pad does not overlap more than 50% of the total surface area of the top surface of the second metal pad.

* * * * *